(12) United States Patent
Fan

(10) Patent No.: US 11,239,758 B2
(45) Date of Patent: Feb. 1, 2022

(54) POWER SUPPLY SYSTEM WITH STABLE LOOP

(71) Applicant: AMLOGIC (SHANGHAI) CO., LTD., Shanghai (CN)

(72) Inventor: Mao Fan, Shanghai (CN)

(73) Assignee: AMLOGIC (SHANGHAI) CO., LTD., Shanghai (CN)

( * ) Notice: Subject to any disclaimer, the term of this patent is extended or adjusted under 35 U.S.C. 154(b) by 414 days.

(21) Appl. No.: 16/342,051

(22) PCT Filed: Nov. 12, 2018

(86) PCT No.: PCT/CN2018/115061
§ 371 (c)(1),
(2) Date: Apr. 15, 2019

(87) PCT Pub. No.: WO2019/200900
PCT Pub. Date: Oct. 24, 2019

(65) Prior Publication Data
US 2021/0336535 A1    Oct. 28, 2021

(30) Foreign Application Priority Data

Apr. 20, 2018  (CN) .......................... 201810360664.7
Apr. 20, 2018  (CN) .......................... 201810361828.8

(51) Int. Cl.
*H02M 3/158* (2006.01)
*H02M 1/08* (2006.01)
(Continued)

(52) U.S. Cl.
CPC ........... *H02M 3/1588* (2013.01); *H02M 1/08* (2013.01); *H02M 1/32* (2013.01); *H02M 3/155* (2013.01); *H03K 5/24* (2013.01)

(58) Field of Classification Search
CPC ....... H02M 3/1588; H02M 3/155; H02M 1/32
See application file for complete search history.

(56) References Cited

U.S. PATENT DOCUMENTS 7,372,241 B1 * 5/2008 Tomiyoshi .......... H02M 3/1588
                                                        323/288
7,821,236 B2 * 10/2010 Hasegawa .......... H02M 3/1588
                                                       323/222
(Continued)

FOREIGN PATENT DOCUMENTS

CN    104506034 A    4/2015
CN    105811760 A    7/2016
(Continued)

OTHER PUBLICATIONS

PCT/CN2018/115061, Written Opinion and Search Report dated Jan. 30, 2019, 9 pages—Chinese, 8 pages—English.

*Primary Examiner* — Kyle J Moody
(74) *Attorney, Agent, or Firm* — Andrew F. Young; Nolte Lackenbach Siegel

(57) ABSTRACT

The invention relates to the field of power and electronic technologies, particularly to a power supply system with a stable loop comprising a PMOS transistor, a NMOS transistor, a first comparator and a voltage control circuit connected between a comparison terminal and the ground; wherein, a current-limiting acquisition port is configured to acquire on-state current of the PMOS transistor; and the current-limiting protection circuit outputs an voltage signal of the comparison result as the control signal of the pulse width modulation driver when the acquired on-current state of the PMOS transistor is less than a preset current value; and outputs a turn-off signal for turning off the pulse width modulation driver as the control signal when the acquired on-current state of the PMOS transistor is greater than a preset current value. The present invention has the advantages that relatively high loop stability can be ensured and high reliability is achieved.

8 Claims, 2 Drawing Sheets

(51) Int. Cl.
*H02M 1/32* (2007.01)
*H02M 3/155* (2006.01)
*H03K 5/24* (2006.01)

(56) References Cited

U.S. PATENT DOCUMENTS

| | | | | |
|---|---|---|---|---|
| 8,093,876 B2* | 1/2012 | Araki | ...................... | H02M 1/32 |
| | | | | 323/284 |
| 11,018,582 B2* | 5/2021 | Bandyopadhyay | ........................... | |
| | | | | H02M 3/1588 |
| 2012/0235656 A1* | 9/2012 | Otsuka | ................ | H02M 3/1588 |
| | | | | 323/282 |
| 2013/0293211 A1* | 11/2013 | Chen | .................. | H02M 3/1588 |
| | | | | 323/282 |
| 2017/0126121 A1* | 5/2017 | Wang | .................... | H02M 3/158 |
| 2021/0083583 A1* | 3/2021 | Becker | .................... | G05F 3/262 |

FOREIGN PATENT DOCUMENTS

| | | | |
|---|---|---|---|
| CN | 106160452 A | 11/2016 | |
| CN | 106160464 A | 11/2016 | |
| CN | 106817022 A | 6/2017 | |
| CN | 108233710 A | 6/2018 | |

\* cited by examiner

POWER SUPPLY SYSTEM WITH STABLE LOOP

CROSS REFERENCE TO RELATED APPLICATIONS

This application relates to, and claims priority as a national phase application from Ser. No. PCT/CN2018/115061 filed Nov. 12, 2018, the entire contents of which are incorporated herein by reference, and which in turn claims priority to and benefit of Chinese Patent App. Ser. No. CN201810360664.7 filed Apr. 20, 2018 and CN201810361828.8 filed Apr. 20, 2018.

FIGURE SELECTED FOR PUBLICATION

FIG. 1

BACKGROUND OF THE INVENTION

1. Field of the Invention

The invention relates to the field of power and electronic technologies, and more particularly, to a power supply system with a stable loop.

2. Description of the Related Art

With a rapid development of a microelectronic technologies, a step-down switching regulator is widely used in step-down occasions by virtue of its simple circuit structure, convenience to adjust and high reliability. Thanks to the operating mode of the step-down switching regulator, conversion efficiency of converters has been improved depending on different control mechanisms, and thus, step-down switching regulators have been widely used in switching power supplies.

However, since conventional switching regulators are highly influenced in a wide range of load variation, a large variation of secondary poles may occur. In this case, when in use, the switching regulators have a relatively poor loop stability under the control of the prior art.

SUMMARY OF THE INVENTION

The present invention provides a power supply system with a stable loop in view of the forgoing problems in the prior art.

Technical solutions are as follows:

A power supply system with a stable loop, comprising:

a pulse width modulation driver, comprising a control input terminal, a first pulse output terminal and a second pulse output terminal;

wherein the pulse width modulation driver receives a control signal via the control input terminal, and outputs a first pulse signal from the first pulse output terminal, and outputs a second pulse signal from the second pulse output terminal based on the control signal;

a PMOS transistor, wherein a gate of the PMOS transistor is connected to the first pulse output terminal;

a NMOS transistor, wherein a gate of the NMOS transistor is connected to the second pulse output terminal;

wherein a drain of the NMOS transistor is connected to a drain of the PMOS transistor to form an output node for outputting an electrical signal;

a first comparator, wherein a positive phase input terminal of the first comparator receives a reference signal;

a negative phase input terminal of the first comparator is connected to the output node through a voltage dividing unit so as to receive a signal which is obtained by performing a voltage reduction operation on the electrical signal at the output node at a preset ratio;

wherein the first comparator compares the reference signal with a signal input from the negative phase input terminal to generate a comparison result voltage signal, and outputting a comparison result voltage signal through a comparison output terminal;

a voltage control circuit, connected between the comparison output terminal and a ground;

a current-limiting protection circuit, comprising a current-limiting input port, a current-limiting acquisition port and a current-limiting control output port;

wherein the current-limiting input port is connected to the comparison output terminal, and the current-limiting control output port is connected to the control input terminal of the pulse modulation driver;

the current-limiting acquisition port is configured to acquire on-state current of the PMOS transistor; the current-limiting protection circuit outputs a voltage signal of the comparison result as the control signal of the pulse width modulation driver when the acquired on-current state of the PMOS transistor is less than a preset current value; and outputs a turn-off signal for turning off the pulse width modulation driver as the control signal when the acquired on-current state of the PMOS transistor is greater than a preset current value.

Preferably, the power supply system with a stable loop further comprises:

a voltage control resistor, comprising a first connection terminal, a second connection terminal and a center tap control terminal;

wherein the first connection terminal is connected to the comparison output terminal; the second connection terminal is connected to a first capacitor; and the center tap control terminal is connected to the comparison output terminal;

the voltage control resistor adjusts a resistance value between the first connection terminal and the second connection terminal according to the comparison result received by the center tap control terminal, and the resistance value is negatively correlated with a voltage value of the comparison result voltage signal; or the power supply system with a stable loop further comprises:

a first diode, wherein a positive electrode of the first diode is connected to the comparison output terminal;

a first resistor, wherein one end of the first resistor is connected to a negative electrode of the first diode;

a second diode, wherein a positive electrode of the second diode is connected to a negative electrode of the first diode;

a second resistor, wherein each of two ends of the second resistor is connected to the negative electrode of the second diode and the comparison output terminal, respectively;

a first capacitor, wherein one end of the first capacitor is connected to the other end of the first resistor at which the first resistor is not connected to the first diode.

Preferably, the comparison result voltage signal has a maximum voltage value of k; and the voltage control resistor has a resolution in a range of k/64 to k/16.

Preferably, a maximum resistance value is 10 MΩ.

Preferably, the second resistor has a resistance value which is greater than that of the first resistor.

Preferably, one end of the first capacitor at which the first resistor is not connected with is grounded.

Preferably, an inductor is connected to the output node;
a second capacitor is connected between the output node and the ground.

Preferably, a drain of the PMOS transistor is connected to a power supply; and
a source of the NMOS transistor is grounded.

Preferably, the pulse width modulation driver further comprises a clock input terminal, and the clock input terminal is configured to receive an outside clock signal.

The technical solutions set forth herein have the following advantages: by adopting a power supply system with a stable loop disclosed in the present invention, relatively high loop stability can be ensured and high reliability is achieved.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
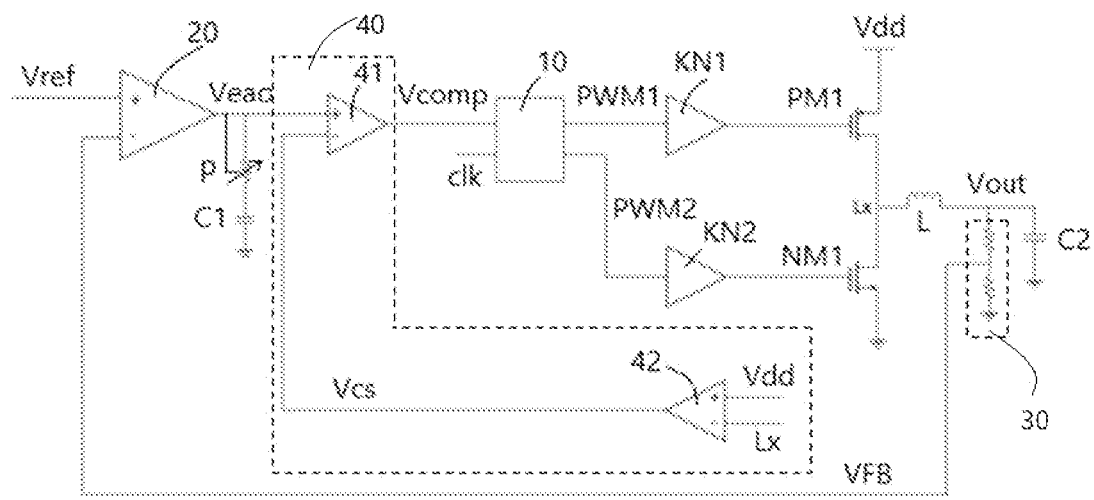
FIG. 1 is a schematic structural diagram of a power supply system with a stable loop according to an embodiment of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, certain exemplary embodiments according to the present disclosure will be described with reference to the accompanying drawings.

The invention discloses a power supply system with a stable loop, comprising:

a pulse width modulation driver 10, comprising a control input terminal, a first pulse output terminal and a second pulse output terminal;

wherein the pulse width modulation driver 10 receives a control signal Vcomp via the control input terminal, and outputs a first pulse signal PWM1 from the first pulse output terminal, and outputs a second pulse signal PWM2 from the second pulse output terminal based on the control signal Vcomp;

a PMOS transistor PM1, wherein a gate of the PMOS transistor PM1 is connected to the first pulse output terminal;

a NMOS transistor NM1, wherein a gate of the NMOS transistor NM1 is connected to the second pulse output terminal;

wherein a drain of the NMOS transistor NM1 is connected to a drain of the PMOS transistor PM1 to form an output node Lx for outputting an electrical signal;

a first comparator 20, wherein a positive phase input terminal of the first comparator 20 receives a reference signal Vref;

a negative phase input terminal of the first comparator 20 is connected to the output voltage Vout through a voltage dividing unit 30 so as to receive a signal VFB which is obtained by performing a voltage reduction operation on the electrical signal at the output voltage Vout at a preset ratio, wherein the first comparator 20 compares the reference signal Vref with the signal (VFB) input from the negative phase input terminal to generate a comparison result voltage signal Veao, and outputting the comparison result voltage signal Veao through a comparison output terminal;

a voltage control circuit, connected between the comparison output terminal Veao and the ground;

a current-limiting protection circuit 40, comprising a current-limiting input port, a current-limiting acquisition port and a current-limiting control output port;

wherein the current-limiting input port is connected to the comparison output terminal Veao, and the current-limiting control output port is connected to the control input terminal of the pulse modulation driver 10;

the current-limiting acquisition port is configured to acquire on-state current of the PMOS transistor PM1; the current-limiting protection circuit 40 outputs an voltage signal of the comparison result Veao as the control signal Vcomp of the pulse width modulation driver 10 when the acquired on-current state of the PMOS transistor PMOS is less than a preset current value; and outputs a turn-off signal for turning off the pulse width modulation driver 10 as the control signal Vcomp when the acquired on-current state of the PMOS transistor PM1 is greater than a preset current value.

In a preferred embodiment, the voltage control circuit comprises a voltage control resistor P, wherein the voltage control resistor P comprises a first connection terminal, a second connection terminal and a center tap control terminal;

wherein the first connection terminal is connected to the comparison output terminal; the second connection terminal is connected to a first capacitor C1; and the center tap control terminal is connected to the comparison output terminal;

the voltage control resistor P adjusts a resistance value between the first connection terminal and the second connection terminal according to the comparison result voltage signal Veao received by the center tap control terminal, and the resistance value is negatively correlated with a voltage value of the comparison result voltage signal Veao; or the voltage control circuit comprises:

a first diode D1, wherein a positive electrode of the first diode D1 is connected to the comparison output terminal;

a first resistor R1, wherein one end of the first resistor R1 is connected to a negative electrode of the first diode D1;

a second diode D2, wherein a positive electrode of the second diode D2 is connected to a negative electrode of the first diode D1;

a second resistor R2, wherein each of two ends of the second resistor R2 is connected to the negative electrode of the second diode D2 and the comparison output terminal, respectively;

a first capacitor C1, wherein one end of the first capacitor C1 is connected to the other end of the first resistor R1 at which the first resistor R1 is not connected to the first diode D1.

Figure 3:
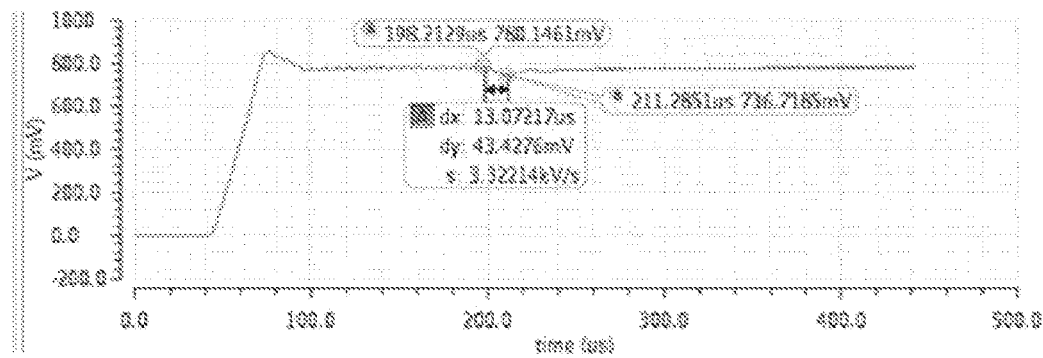
FIG. 3 is a waveform diagram of an output voltage of a power supply system in the prior art.
Figure 4:
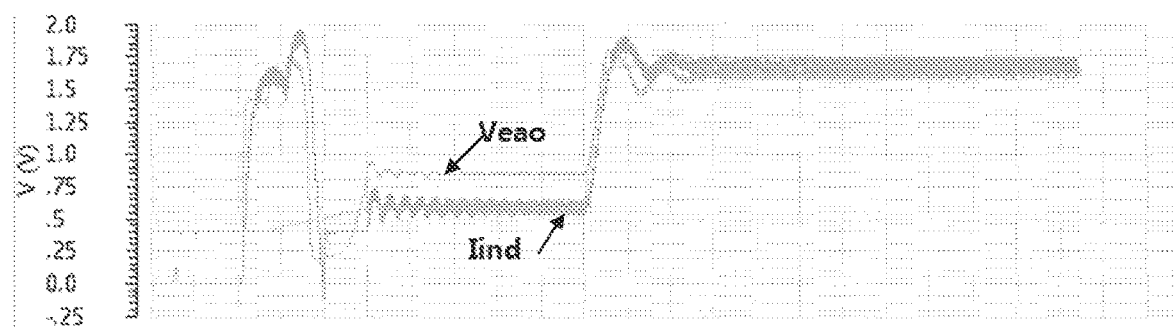
FIG. 4 is a waveform diagram of signals of various nodes in a power supply system with a stable loop according to a previous embodiment of the present invention.
Figure 5:
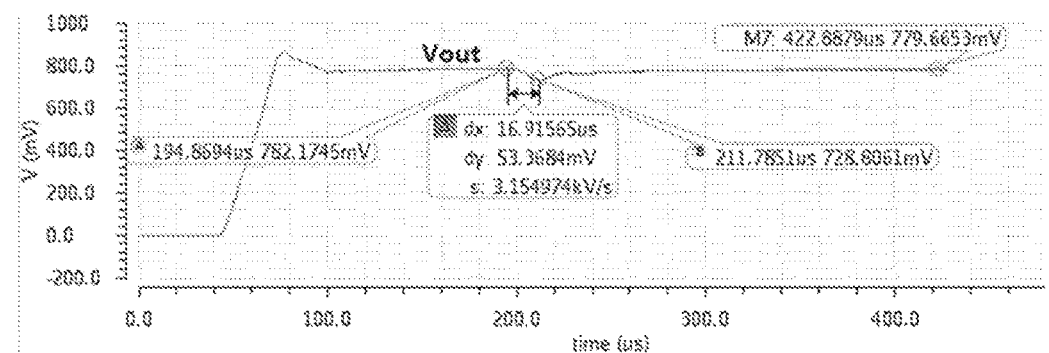
FIG. 5 is a waveform diagram of an output voltage in a power supply system with a stable loop according to a previous embodiment of the present invention.

In a preferred embodiment, as shown in FIG. 1, the current-limiting protection circuit 40 may specifically comprise a second comparator 41 and a third comparator 42; a positive phase input terminal of the second comparator 41 is used as the current-limiting input port of the current-limiting protection circuit 40, and a negative phase input terminal of the second comparator 41 is connected to a output terminal of the third comparator 42, and a output terminal of the second comparator 41 is used as the current-limiting control output terminal of the current-limiting protection circuit 40; a negative phase input terminal of the third comparator 42 receives a power supply Vdd, a negative phase input terminal of the third comparator 42 is connected to the output nod Lx, wherein the positive phase input terminal and the negative phase input terminal of the third comparator 42 form the current-limiting acquisition port of the current-limiting protection circuit 40; the third comparator 42 transmits the comparison result to the negative phase input terminal of the second comparator 41, that is, the signal VCS; the current-limiting control output port outputs the control signal; an inductor L and a second capacitor C2 may also be connected to the output node Lx; a first pre-driver KN1 may be connected between the first pulse output terminal PWM1 and the PMOS transistor PM1, and a second pre-driver KN2 may be connected between the second pulse output terminal PWM2 and the NMOS transistor NM1; by utilizing the resistance value of the voltage control resistor P, which is negatively correlated with a voltage value of the comparison result voltage signal, the process of charging the first capacitor C1 can be done quickly, while the speed for discharging the first capacitor C1 can keep stable, thereby, the stability of the loop is improved; referring to FIG. 4, by adopting the technical solutions in the present invention, the comparison result voltage signal Veao and current at the inductor L have become much more stable; by comparing FIGS. 3 and 5, it is apparent that the output voltage Vout is less volatile by using the technical solutions in the present invention.

In the above-mentioned embodiment, the comparison result voltage signal Veao has a maximum voltage value of k; and the voltage control resistor P has a resolution in the range of k/64 to k/16, for example, k/64, or, k/8, or k/32, or k/24, etc.;

the voltage control resistor P may have the maximum resistance value of 10 M Ω.

Specifically, the maximum resistance value k may be set as required, and no limitations will be made here.

Figure 2:
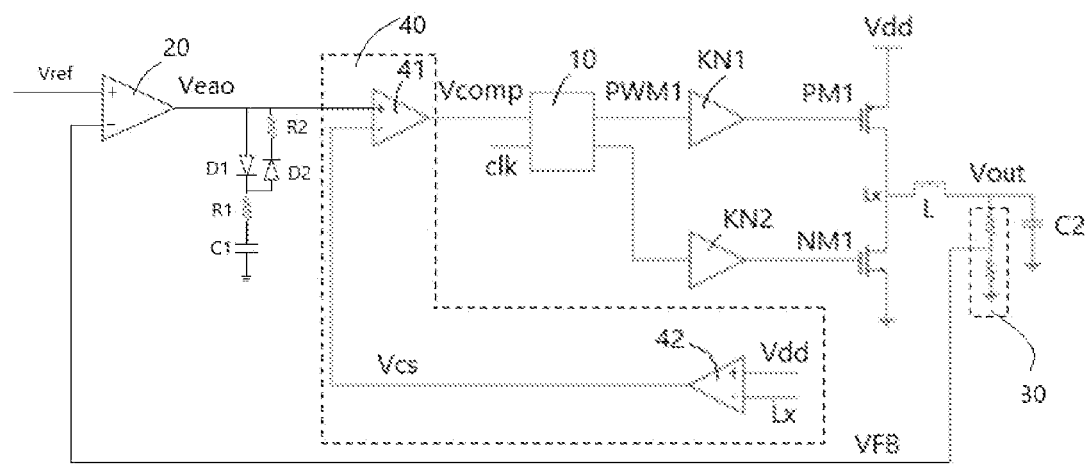
FIG. 2 is another schematic structural diagram of a power supply system with a stable loop according to an embodiment of the present invention.

In another preferred embodiment, as shown in FIG. 2, the current-limiting protection circuit 40 may specifically comprise a second comparator 41 and a third comparator 42; a positive phase input terminal of the second comparator 41 is used as the current-limiting input port of the current-limiting protection circuit 40, and a negative phase input terminal of the second comparator 41 is connected to a output terminal of the third comparator 42, and a output terminal of the second comparator 41 is used as the current-limiting control output terminal of the current-limiting protection circuit 40; a positive phase input terminal of the third comparator 42 receives a power supply Vdd, a negative input terminal of the third comparator 42 is connected to the output node Lx, wherein the positive phase input terminal and the negative phase input terminal of the third comparator 42 form the current-limiting acquisition port of the current-limiting protection circuit 40; the third comparator 42 transmits the comparison result to the negative phase input terminal of the second comparator 41, that is, the signal VCS; the current-limiting control output port outputs the control signal; an inductor L and a second capacitor C2 may also be connected to the output node Lx; a first pre-driver KN1 may be connected between the first pulse output terminal and the PMOS transistor PM1, and a second pre-driver KN2 may be connected between the second pulse output terminal and the NMOS transistor NM1; referring to FIG. 4, by adopting the technical solutions in the present invention, the comparison result voltage signal Veao and current at the inductor L have become much more stable; by comparing FIGS. 3 and 5, it is apparent that the output voltage Vout is less volatile by using the technical solutions in the present invention.

In a preferred embodiment, the second resistor R2 may have a resistance value which is greater than that of the first resistor R1; and one end of the first capacitor C1 at which the first resistor R1 is not connected with is grounded.

Specifically, such an arrangement makes it possible for speeding up the process for charging the first capacitor C1, and lowering the speed for discharging the first capacitor C1.

In a preferred embodiment, an inductor L is connected to the output node Lx;

a second capacitor C2 is connected between the output voltage and the ground.

In a preferred embodiment, the source of the PMOS transistor PM1 is connected to a power supply Vdd; and the source of the NMOS transistor NM1 may be grounded.

In a preferred embodiment, the pulse width modulation driver 10 may further comprises a clock input terminal, and the clock input terminal is configured to receive an outside clock signal clk.

In conclusion, the present invention discloses a power supply system with a stable loop, comprising: a pulse width modulation driver comprising a control input terminal, a first pulse output terminal and a second pulse output terminal; wherein the pulse width modulation driver receives a control signal via the control input terminal, and outputs a first pulse signal from the first pulse output terminal, and outputs a second pulse signal from the second pulse output terminal based on the control signal; a PMOS transistor, wherein a gate of the PMOS transistor is connected to the first pulse output terminal; a NMOS transistor, wherein a gate of the NMOS transistor is connected to the second pulse output terminal; wherein a drain of the NMOS transistor is connected to a drain of the PMOS transistor to form an output node for outputting an electrical signal; a first comparator, wherein a positive phase input terminal of the first comparator receives a reference signal; a negative phase input terminal of the first comparator is connected to the output voltage through a voltage dividing unit so as to receive a signal which is obtained by performing a voltage reduction operation on the electrical signal at the output voltage at a preset ratio; wherein the first comparator compares the reference signal with a signal input from the negative phase input terminal to generate a comparison result voltage signal, and outputting the comparison result voltage signal through a comparison output terminal; a current-limiting protection circuit, comprising a current-limiting input port, a current-limiting acquisition port and a current-limiting control output port; wherein the current-limiting input port is connected to the comparison output terminal, and the current-limiting control output port is connected to the control input terminal of the pulse modulation driver; the current-limiting acquisition port is configured to acquire on-state current of the PMOS transistor; the current-limiting protection circuit outputs an voltage signal of the comparison result as the control signal of the pulse width modulation driver when the acquired on-current state of the PMOS transistor is less than a preset current value; and outputs a turn-off signal for turning off the pulse width modulation driver as the control signal when the acquired on-current state of the PMOS transistor is greater than a preset current value; relatively high loop stability can be ensured and high reliability is achieved.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A power supply system with a stable loop, comprising:
a pulse width modulation driver comprising a control input terminal, a first pulse output terminal and a second pulse output terminal;
wherein the pulse width modulation driver receives a control signal via the control input terminal, and outputs a first pulse signal from the first pulse output terminal, and outputs a second pulse signal from the second pulse output terminal based on the control signal;
a PMOS transistor, wherein a gate of the PMOS transistor is connected to the first pulse output terminal;
a NMOS transistor, wherein a gate of the NMOS transistor is connected to the second pulse output terminal;
wherein a drain of the NMOS transistor is connected to a drain of the PMOS transistor to form an output node for outputting an electrical signal;
a first comparator, wherein a positive phase input terminal of the first comparator receives a reference signal;
a negative phase input terminal of the first comparator is connected to the output node through a voltage dividing unit so as to receive a signal which is obtained by performing a voltage reduction operation on the electrical signal at the output node at a preset ratio;
wherein the first comparator compares the reference signal with a signal input from the negative phase input terminal to generate a comparison result voltage signal, and outputting a comparison result voltage signal through a comparison output terminal;
a voltage control circuit, connected between the comparison output terminal and a ground;
a current-limiting protection circuit, comprising a current-limiting input port, a current-limiting acquisition port and a current-limiting control output port;
wherein the current-limiting input port is connected to the comparison output terminal, and the current-limiting control output port is connected to the control input terminal of the pulse modulation driver;
the current-limiting acquisition port is configured to acquire on-state current of the PMOS transistor; the current-limiting protection circuit outputs a voltage signal of the comparison result as the control signal of the pulse width modulation driver when the acquired on-current state of the PMOS transistor is less than a preset current value; and outputs a turn-off signal for turning off the pulse width modulation driver as the control signal when the acquired on-current state of the PMOS transistor is greater than a preset current value;
wherein the voltage control circuit comprises:
a voltage control resistor, comprising a first connection terminal, a second connection terminal and a center tap control terminal;
wherein the first connection terminal is connected to the comparison output terminal; the second connection terminal is connected to a first capacitor; and the center tap control terminal is connected to the comparison output terminal;
the voltage control resistor adjusts a resistance value between the first connection terminal and the second connection terminal according to the comparison result received by the center tap control terminal, and the resistance value is negatively correlated with a voltage value of the comparison result voltage signal; or
the voltage control circuit comprises:
a first diode, wherein a positive electrode of the first diode is connected to the comparison output terminal;
a first resistor, wherein one end of the first resistor is connected to a negative electrode of the first diode;
a second diode, wherein a positive electrode of the second diode is connected to a negative electrode of the first diode;
a second resistor, wherein each of two ends of the second resistor is connected to a negative electrode of the second diode and the comparison output terminal, respectively;
a first capacitor, wherein one end of the first capacitor is connected to the other end of the first resistor at which the first resistor is not connected to the first diode.

2. The power supply system with the stable loop as claimed in claim 1, wherein the comparison result voltage signal has a maximum voltage value of k; and
the voltage control resistor has a resolution in a range of k/64 to k/16.

3. The power supply system with the stable loop as claimed in claim 1, wherein a maximum resistance value is 10 MΩ.

4. The power supply system with the stable loop as claimed in claim 1, wherein the second resistor has a resistance value which is greater than that of the first resistor.

5. The power supply system with the stable loop as claimed in claim 1, wherein one end of the first capacitor at which the first resistor is not connected with is grounded.

6. The power supply system with the stable loop as claimed in claim 1, wherein an inductor is connected to the output node;

a second capacitor is connected between the output node and the ground.

7. The power supply system with the stable loop as claimed in claim 1, wherein a source of the PMOS transistor is connected to a power supply; and a source of the NMOS transistor is grounded.

8. The power supply system with the stable loop as claimed in claim 1, wherein the pulse width modulation driver further comprises a clock input terminal, and the clock input terminal is configured to receive an outside clock signal.

\* \* \* \* \*